(12) United States Patent
Bower et al.

(10) Patent No.: US 10,181,507 B2
(45) Date of Patent: Jan. 15, 2019

(54) DISPLAY TILE STRUCTURE AND TILED DISPLAY

(71) Applicant: X-Celeprint Limited, Cork (IE)

(72) Inventors: Christopher Bower, Raleigh, NC (US); Matthew Meitl, Durham, NC (US); Ronald S. Cok, Rochester, NY (US)

(73) Assignee: X-Celeprint Limited, Cork (IE)

( * ) Notice: Subject to any disclaimer, the term of this patent is extended or adjusted under 35 U.S.C. 154(b) by 0 days.

(21) Appl. No.: 15/644,570

(22) Filed: Jul. 7, 2017

(65) Prior Publication Data

US 2017/0309698 A1    Oct. 26, 2017

Related U.S. Application Data

(62) Division of application No. 14/822,866, filed on Aug. 10, 2015, now Pat. No. 9,741,785.

(51) Int. Cl.
*H01L 27/32* (2006.01)
*G06F 3/044* (2006.01)
(Continued)

(52) U.S. Cl.
CPC .......... *H01L 27/3293* (2013.01); *G06F 3/044* (2013.01); *G06F 3/0416* (2013.01);
(Continued)

(58) Field of Classification Search
CPC ....... H01L 33/48; H01L 33/502; H01L 33/60; H01L 33/508; H01L 33/38; H01L 33/405; H01L 33/20; H01L 33/62; H05B 33/089
See application file for complete search history.

(56) References Cited

U.S. PATENT DOCUMENTS

| 4,322,735 | A | 3/1982 | Sadamasa et al. |
| 4,330,329 | A | 5/1982 | Hayashi et al. |

(Continued)

FOREIGN PATENT DOCUMENTS

| EP | 1548571 A1 | 6/2005 |
| JP | H11-142878 A | 5/1999 |

(Continued)

OTHER PUBLICATIONS

Chesterfield, R. J. et al., 63.3:Multinozzle Printing: A Cost-effective Process for OLED Display Fabrication, SID 2009 Digest, vol. XL:Book II, 951-954.

(Continued)

*Primary Examiner* — Mohammed R Alam
(74) *Attorney, Agent, or Firm* — William R. Haulbrook; Michael D. Schmitt; Choate, Hall & Stewart

(57) ABSTRACT

A display tile structure includes a tile layer with opposing emitter and backplane sides. A light emitter having first and second electrodes for conducting electrical current to cause the light emitter to emit light is disposed in the tile layer. First and second electrically conductive tile micro-wires and first and second conductive tile contact pads are electrically connected to the first and second tile micro-wires, respectively. The light emitter includes a plurality of semiconductor layers and the first and second electrodes are disposed on a common side of the semiconductor layers opposite the emitter side of the tile layer. The first and second tile micro-wires and first and second tile contact pads are disposed on the backplane side of the tile layer.

20 Claims, 8 Drawing Sheets

(51) Int. Cl.
*H01L 33/58* (2010.01)
*H01L 33/62* (2010.01)
*G06F 3/041* (2006.01)
*H01L 25/04* (2014.01)
*H01L 25/075* (2006.01)
*H01L 27/15* (2006.01)
*H01L 33/64* (2010.01)
*H01L 51/52* (2006.01)
*H01L 51/56* (2006.01)

(52) U.S. Cl.
CPC ........ *H01L 25/048* (2013.01); *H01L 25/0753* (2013.01); *H01L 27/156* (2013.01); *H01L 27/3276* (2013.01); *H01L 27/3288* (2013.01); *H01L 33/58* (2013.01); *H01L 33/62* (2013.01); *H01L 33/64* (2013.01); *H01L 51/529* (2013.01); *H01L 51/56* (2013.01); *H01L 2224/18* (2013.01); *H01L 2227/326* (2013.01); *H01L 2933/0066* (2013.01); *H01L 2933/0075* (2013.01)

(56) References Cited

U.S. PATENT DOCUMENTS

| | | |
|---|---|---|
| 4,591,659 A | 5/1986 | Leibowitz |
| 5,173,759 A | 12/1992 | Anzaki et al. |
| 5,550,066 A | 8/1996 | Tang et al. |
| 5,563,470 A | 10/1996 | Li |
| 5,621,555 A | 4/1997 | Park |
| 5,625,202 A | 4/1997 | Chai |
| 5,629,132 A | 5/1997 | Suzuki et al. |
| 5,686,790 A | 11/1997 | Curtin et al. |
| 5,739,800 A | 4/1998 | Lebby et al. |
| 5,780,933 A | 7/1998 | Ohmori et al. |
| 5,815,303 A | 9/1998 | Berlin |
| 5,994,722 A | 11/1999 | Averbeck et al. |
| 6,025,730 A | 2/2000 | Akram et al. |
| 6,084,579 A | 7/2000 | Hirano |
| 6,087,680 A | 7/2000 | Gramann et al. |
| 6,142,358 A | 11/2000 | Cohn et al. |
| 6,143,672 A | 11/2000 | Ngo et al. |
| 6,169,294 B1 | 1/2001 | Biing-Jye et al. |
| 6,184,477 B1 | 2/2001 | Tanahashi |
| 6,278,242 B1 | 8/2001 | Cok et al. |
| 6,392,292 B1 | 5/2002 | Morishita |
| 6,392,340 B2 | 5/2002 | Yoneda et al. |
| 6,403,985 B1 | 6/2002 | Fan et al. |
| 6,410,942 B1 | 6/2002 | Thibeault et al. |
| 6,422,716 B2 | 7/2002 | Henrici et al. |
| 6,424,028 B1 | 7/2002 | Dickinson |
| 6,466,281 B1 | 10/2002 | Huang et al. |
| 6,504,180 B1 | 1/2003 | Heremans et al. |
| 6,577,367 B2 | 6/2003 | Kim |
| 6,660,457 B1 | 12/2003 | Imai et al. |
| 6,703,780 B2 | 3/2004 | Shiang et al. |
| 6,717,560 B2 | 4/2004 | Cok et al. |
| 6,756,576 B1 | 6/2004 | McElroy et al. |
| 6,812,637 B2 | 11/2004 | Cok et al. |
| 6,828,724 B2 | 12/2004 | Burroughes |
| 6,853,411 B2 | 2/2005 | Freidhoff et al. |
| 6,897,855 B1 | 5/2005 | Matthies et al. |
| 6,933,532 B2 | 8/2005 | Arnold et al. |
| 6,969,624 B2 | 11/2005 | Iwafuchi et al. |
| 6,975,369 B1 | 12/2005 | Burkholder |
| 7,009,220 B2 | 3/2006 | Oohata |
| 7,012,382 B2 | 3/2006 | Cheang et al. |
| 7,091,523 B2 | 8/2006 | Cok et al. |
| 7,098,589 B2 | 8/2006 | Erchak et al. |
| 7,127,810 B2 | 10/2006 | Kasuga et al. |
| 7,129,457 B2 | 10/2006 | McElroy et al. |
| 7,169,652 B2 | 1/2007 | Kimura |
| 7,195,733 B2 | 3/2007 | Rogers et al. |
| 7,259,391 B2 | 8/2007 | Liu et al. |
| 7,288,753 B2 | 10/2007 | Cok |
| 7,394,194 B2 | 7/2008 | Cok |
| 7,402,951 B2 | 7/2008 | Cok |
| 7,420,221 B2 | 9/2008 | Nagai |
| 7,466,075 B2 | 12/2008 | Cok et al. |
| 7,479,731 B2 | 1/2009 | Udagawa |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,687,812 B2 | 3/2010 | Louwsma et al. |
| 7,704,684 B2 | 4/2010 | Rogers et al. |
| 7,791,271 B2 | 9/2010 | Cok et al. |
| 7,799,699 B2 | 9/2010 | Nuzzo et al. |
| 7,816,856 B2 | 10/2010 | Cok et al. |
| 7,834,541 B2 | 11/2010 | Cok |
| 7,893,612 B2 | 2/2011 | Cok |
| 7,919,342 B2 | 4/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,969,085 B2 | 6/2011 | Cok |
| 7,972,875 B2 | 7/2011 | Rogers et al. |
| 7,982,296 B2 | 7/2011 | Nuzzo et al. |
| 7,990,058 B2 | 8/2011 | Cok et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,243,027 B2 | 8/2012 | Hotelling et al. |
| 8,261,660 B2 | 9/2012 | Menard |
| 8,288,843 B2 | 10/2012 | Kojima et al. |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,450,927 B2 | 5/2013 | Lenk et al. |
| 8,470,701 B2 | 6/2013 | Rogers et al. |
| 8,502,192 B2 | 8/2013 | Kwak et al. |
| 8,506,867 B2 | 8/2013 | Menard |
| 8,531,642 B2 | 9/2013 | Kiryuschev et al. |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,735,932 B2 | 5/2014 | Kim et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,860,051 B2 | 10/2014 | Fellows et al. |
| 8,877,648 B2 | 11/2014 | Bower et al. |
| 8,884,844 B2 | 11/2014 | Yang et al. |
| 8,889,485 B2 | 11/2014 | Bower |
| 8,895,406 B2 | 11/2014 | Rogers et al. |
| 8,902,152 B2 | 12/2014 | Bai et al. |
| 8,946,760 B2 | 2/2015 | Kim |
| 8,987,765 B2 | 3/2015 | Bibl et al. |
| 9,105,813 B1 | 8/2015 | Chang |
| 9,142,468 B2 | 9/2015 | Bower et al. |
| 9,153,171 B2 | 10/2015 | Sakariya et al. |
| 9,178,123 B2 | 11/2015 | Sakariya et al. |
| 9,202,996 B2 | 12/2015 | Orsley et al. |
| 9,308,649 B2 | 4/2016 | Golda et al. |
| 9,355,854 B2 | 5/2016 | Meitl et al. |
| 9,368,683 B1 | 6/2016 | Meitl et al. |
| 9,437,782 B2 | 9/2016 | Bower et al. |
| 9,444,015 B2 | 9/2016 | Bower et al. |
| 9,496,155 B2 | 11/2016 | Menard et al. |
| 9,520,537 B2 | 12/2016 | Bower et al. |
| 9,537,069 B1 | 1/2017 | Bower et al. |
| 9,555,644 B2 | 1/2017 | Rogers et al. |
| 9,626,908 B2 | 4/2017 | Sakariya et al. |
| 9,761,754 B2 | 9/2017 | Bower et al. |

(56) References Cited

U.S. PATENT DOCUMENTS

| | | | |
|---|---|---|---|
| 9,899,329 B2 | 2/2018 | Bower | |
| 9,899,465 B2 | 2/2018 | Bower et al. | |
| 2001/0022564 A1 | 9/2001 | Youngquist et al. | |
| 2002/0096994 A1 | 7/2002 | Iwafuchi et al. | |
| 2003/0211649 A1 | 11/2003 | Hirai et al. | |
| 2004/0180476 A1 | 9/2004 | Kazlas et al. | |
| 2004/0212296 A1 | 10/2004 | Nakamura et al. | |
| 2004/0227704 A1 | 11/2004 | Wang et al. | |
| 2004/0252933 A1 | 12/2004 | Sylvester et al. | |
| 2005/0006657 A1 | 1/2005 | Terashita | |
| 2005/0012076 A1 | 1/2005 | Morioka | |
| 2005/0116324 A1 | 6/2005 | Yamaguchi | |
| 2005/0116621 A1 | 6/2005 | Bellmann et al. | |
| 2005/0140275 A1 | 6/2005 | Park | |
| 2005/0168987 A1 | 8/2005 | Tamaoki et al. | |
| 2005/0202595 A1 | 9/2005 | Yonehara et al. | |
| 2005/0264472 A1 | 12/2005 | Rast | |
| 2005/0275615 A1 | 12/2005 | Kahen et al. | |
| 2005/0285246 A1 | 12/2005 | Haba et al. | |
| 2006/0051900 A1 | 3/2006 | Shizuno | |
| 2006/0055864 A1 | 3/2006 | Matsumura et al. | |
| 2006/0063309 A1 | 3/2006 | Sugiyama et al. | |
| 2006/0116046 A1 | 6/2006 | Morley et al. | |
| 2007/0035340 A1 | 2/2007 | Kimura | |
| 2007/0077349 A1 | 4/2007 | Newman et al. | |
| 2007/0201056 A1 | 8/2007 | Cok et al. | |
| 2007/0235849 A1 | 10/2007 | Othieno et al. | |
| 2008/0006843 A1 | 1/2008 | Dai et al. | |
| 2008/0211734 A1 | 9/2008 | Huitema et al. | |
| 2008/0224153 A1 | 9/2008 | Tomoda | |
| 2008/0224254 A1 | 9/2008 | Couillard et al. | |
| 2009/0053498 A1 | 2/2009 | Matsuura et al. | |
| 2009/0278141 A1 | 11/2009 | Coe-Sullivan et al. | |
| 2009/0278142 A1 | 11/2009 | Watanabe et al. | |
| 2009/0315054 A1 | 12/2009 | Kim et al. | |
| 2010/0060553 A1 | 3/2010 | Zimmerman et al. | |
| 2010/0078670 A1 | 4/2010 | Kim et al. | |
| 2010/0123134 A1 | 5/2010 | Nagata | |
| 2010/0123268 A1 | 5/2010 | Menard | |
| 2010/0148198 A1 | 6/2010 | Sugizaki et al. | |
| 2010/0186883 A1 | 7/2010 | Tomoda | |
| 2010/0190293 A1 | 7/2010 | Maeda et al. | |
| 2010/0207852 A1 | 8/2010 | Cok | |
| 2010/0214247 A1 | 8/2010 | Tang et al. | |
| 2010/0248484 A1 | 9/2010 | Bower et al. | |
| 2010/0258710 A1 | 10/2010 | Wiese et al. | |
| 2010/0264816 A1 | 10/2010 | Cok | |
| 2010/0289115 A1 | 11/2010 | Akiyama et al. | |
| 2010/0317132 A1 | 12/2010 | Rogers et al. | |
| 2011/0043435 A1 | 2/2011 | Hebenstreit et al. | |
| 2011/0067911 A1 | 3/2011 | Ishikawa et al. | |
| 2011/0108800 A1 | 5/2011 | Pan | |
| 2011/0133324 A1 | 6/2011 | Fan et al. | |
| 2011/0147715 A1 | 6/2011 | Rogers et al. | |
| 2011/0211348 A1 | 9/2011 | Kim | |
| 2012/0009738 A1 | 1/2012 | Crawford et al. | |
| 2012/0080692 A1 | 4/2012 | Ohtorii | |
| 2012/0119249 A1 | 5/2012 | Kim et al. | |
| 2012/0141799 A1 | 6/2012 | Kub et al. | |
| 2012/0223636 A1 | 9/2012 | Shin et al. | |
| 2012/0223875 A1 | 9/2012 | Lau et al. | |
| 2012/0228669 A1 | 9/2012 | Bower et al. | |
| 2012/0256163 A1 | 10/2012 | Yoon et al. | |
| 2012/0313241 A1 | 12/2012 | Bower | |
| 2012/0314388 A1 | 12/2012 | Bower et al. | |
| 2012/0319563 A1* | 12/2012 | Ishihara | H01L 33/505 313/498 |
| 2013/0015483 A1 | 1/2013 | Shimokawa et al. | |
| 2013/0036928 A1 | 2/2013 | Rogers et al. | |
| 2013/0069275 A1 | 3/2013 | Menard et al. | |
| 2013/0088416 A1 | 4/2013 | Smith et al. | |
| 2013/0196474 A1 | 8/2013 | Meitl et al. | |
| 2013/0207964 A1 | 8/2013 | Fleck et al. | |
| 2013/0221355 A1 | 8/2013 | Bower et al. | |
| 2013/0249138 A1 | 9/2013 | DeSimone et al. | |
| 2013/0273695 A1 | 10/2013 | Menard et al. | |
| 2013/0309792 A1 | 11/2013 | Tischler et al. | |
| 2013/0333094 A1 | 12/2013 | Rogers et al. | |
| 2014/0104243 A1 | 4/2014 | Sakariya et al. | |
| 2014/0146273 A1 | 5/2014 | Kim et al. | |
| 2014/0175498 A1 | 6/2014 | Lai | |
| 2014/0183446 A1 | 7/2014 | Nago et al. | |
| 2014/0217448 A1 | 8/2014 | Kim et al. | |
| 2014/0231839 A1 | 8/2014 | Jeon et al. | |
| 2014/0231851 A1 | 8/2014 | Tsai et al. | |
| 2014/0264763 A1 | 9/2014 | Meitl et al. | |
| 2014/0267683 A1 | 9/2014 | Bibl et al. | |
| 2014/0306248 A1 | 10/2014 | Ahn et al. | |
| 2014/0367633 A1 | 12/2014 | Bibl et al. | |
| 2014/0367705 A1 | 12/2014 | Bibl et al. | |
| 2015/0135525 A1 | 5/2015 | Bower | |
| 2015/0137153 A1 | 5/2015 | Bibl et al. | |
| 2015/0169011 A1 | 6/2015 | Bibl et al. | |
| 2015/0263066 A1 | 9/2015 | Hu et al. | |
| 2015/0280066 A1 | 10/2015 | Fujimura et al. | |
| 2015/0280089 A1 | 10/2015 | Obata et al. | |
| 2015/0371585 A1 | 12/2015 | Bower et al. | |
| 2015/0371974 A1 | 12/2015 | Bower et al. | |
| 2015/0372051 A1 | 12/2015 | Bower et al. | |
| 2015/0372052 A1 | 12/2015 | Bower et al. | |
| 2015/0372053 A1 | 12/2015 | Bower et al. | |
| 2015/0372187 A1 | 12/2015 | Bower et al. | |
| 2015/0373793 A1 | 12/2015 | Bower et al. | |
| 2016/0005721 A1 | 1/2016 | Bower et al. | |
| 2016/0018094 A1 | 1/2016 | Bower et al. | |
| 2016/0064363 A1 | 3/2016 | Bower et al. | |
| 2016/0066789 A1 | 3/2016 | Rogers et al. | |
| 2016/0093600 A1 | 3/2016 | Bower et al. | |
| 2016/0308103 A1 | 10/2016 | Hu et al. | |
| 2017/0025593 A1 | 1/2017 | Bower et al. | |
| 2017/0047393 A1 | 2/2017 | Bower et al. | |
| 2017/0187976 A1 | 6/2017 | Cok | |
| 2017/0206845 A1 | 7/2017 | Sakariya et al. | |
| 2017/0210117 A1 | 7/2017 | Rogers et al. | |
| 2017/0213803 A1 | 7/2017 | Bower | |
| 2017/0250167 A1 | 8/2017 | Bower et al. | |
| 2018/0130751 A1 | 5/2018 | Bower | |
| 2018/0138071 A1 | 5/2018 | Bower et al. | |

FOREIGN PATENT DOCUMENTS

| | | |
|---|---|---|
| JP | 2011/066130 A | 3/2011 |
| WO | WO-2006/027730 A1 | 3/2006 |
| WO | WO-2006/099741 A1 | 9/2006 |
| WO | WO-2008/103931 A2 | 8/2008 |
| WO | WO-2010/032603 A1 | 3/2010 |
| WO | WO-2010/102310 A2 | 9/2010 |
| WO | WO-2010/111601 A2 | 9/2010 |
| WO | WO-2010/132552 A1 | 11/2010 |
| WO | WO-2013/064800 A1 | 5/2013 |
| WO | WO-2014/121635 A1 | 8/2014 |
| WO | WO-2014/149864 A1 | 9/2014 |
| WO | WO-2016/046283 A2 | 3/2016 |
| WO | WO-2017/144573 A1 | 8/2017 |

OTHER PUBLICATIONS

Choi, H. W. et al., Efficient GaN-based Micro-LED Arrays, Mat. Res. Soc. Symp. Proc. 743:L6.28.1-L6.28.6 (2003).

Hamer et al., 63.2: AMOLED Displays Using Transfer-Printed Integrated Circuits, SID 09 Digest, 40(2):947-950 (2009).

Lee, S. H. etal, Laser Lift-Offof GaN Thin Film and its Application to the Flexible Light Emitting Diodes, Proc. of SPIE 8460:846011-1-846011-6 (2012).

Ohno, Y. and Ohzeki, Y., Development of Ultrathin Bonding Wire for Fine Pitch Bonding, Nippon Steel Technical Report 59:1-5 (1993).

Poher, V. et al., Micro-LED arrays: a tool for two-dimensional neuron stimulation, J. Phys. D: Appl. Phys. 41:094014 (2008).

Roscher, H., VCSEL Arrays with Redundant Pixel Designs for 10Gbits/s 2-D Space-Parallel MMF Transmission, Annual Report, optoelectronics Department, (2005).

(56) References Cited

OTHER PUBLICATIONS

Yaniv et al., A 640 × 480 Pixel Computer Display Using Pin Diodes with Device Redundancy, 1988 International Display Research Conference, IEEE, CH-2678-1/88:152-154 (1988).

* cited by examiner

DISPLAY TILE STRUCTURE AND TILED DISPLAY

PRIORITY APPLICATION

This application is a divisional of U.S. patent application Ser. No. 14/822,866, filed on Aug. 10, 2015, the disclosure of which is hereby incorporated by reference herein in its entirety.

CROSS REFERENCE TO RELATED APPLICATIONS

Reference is made to commonly assigned U.S. patent application Ser. No. 14/807,259, filed Jul. 23, 2015 and entitled Redistribution Layer for Substrate Contacts by Bower et al, to commonly assigned U.S. patent application Ser. No. 14/743,984, filed Jun. 18, 2015 and entitled Systems and Methods for Preparing GaN and Related Materials for Micro Assembly by Bower et al, to commonly assigned U.S. patent application Ser. No. 14/807,311, filed Jul. 23, 2015 and entitled Printable Inorganic Semiconductor Method by Meitl et al, to commonly assigned U.S. patent application Ser. No. 14/818,201, filed Aug. 4, 2015 and entitled Inorganic-Light-Emitter Display with Integrated Black Matrix by Bower et al, to commonly assigned U.S. patent application Ser. No. 14/743,981, filed Jun. 18, 2015 and entitled Micro-Assembled Micro LED Displays and Lighting Elements by Bower et al, and to commonly assigned U.S. Patent Application Ser. No. 62/055,472 filed Sep. 25, 2014 and entitled Compound Micro-Assembly Strategies and Devices by Bower et al, the disclosures of which are incorporated herein by reference in their entirety.

FIELD OF THE INVENTION

The present invention relates to a large-format display structure having pixel tiles located on a backplane forming a tiled display.

BACKGROUND OF THE INVENTION

Flat-panel displays are widely used in conjunction with computing devices, in portable devices, and for entertainment devices such as televisions. Such displays typically employ a plurality of pixels distributed over a display substrate to display images, graphics, or text. For example, liquid crystal displays (LCDs) employ liquid crystals to block or transmit light from a backlight behind the liquid crystals and organic light-emitting diode (OLED) displays rely on passing current through a layer of organic material that glows in response to the electrical current. Inorganic light-emitting diodes (LEDs) are also used in displays.

Most flat-panel displays use active-matrix thin-film transistors formed in a thin semiconductor layer on a substrate to control an array of light-emitting or light-controlling elements. However, the thin layer of semiconductor material is typically amorphous or has localized crystals, for example in amorphous silicon or polysilicon. These semiconductor material structures have a much lower performance than crystalline semiconductors found in typical integrated circuits. Moreover, it is difficult and expensive to make thin-film semiconductor structures on large substrates, limiting the size of integrated flat-panel devices such as displays. Passive-matrix control structures that do not require a thin-film semiconductor layer are also known but are limited in size resolution, and refresh rate.

At least in part because of these technical challenges, flat-panel displays were originally relatively small, for example having a display substrate diagonal measurement of only a few centimeters. As display substrate processing technology has improved, displays have increased in size, for example displays over three meters in diagonal have been demonstrated.

Large-format outdoor displays typically use inorganic light-emitting diodes (LEDs) individually mounted in a frame. In some displays, groups of LEDs are mounted in tiles and the tiles are assembled into the final display. If an LED in a tile fails, the faulty tile is removed and a good tile replaces the faulty tile. Moreover, tiles can be tested before assembly, increasing display yields. The use of tiles increases the available size of a display since each tile is separately made and is much smaller than the size of the display itself. However, it is in general challenging to provide electrical interconnections to the pixels in the tiles and to maintain a constant pixel pitch across the tile boundaries.

A variety of tiled display structures are known. U.S. Pat. No. 5,563,470 discloses a tiled panel display assembly with a common substrate on which a plurality of small display tiles are mounted in an array and electrically interconnected to form a large-area panel. Each tile includes a plurality of contact pads that are aligned with corresponding contact pads on the substrate. Solder joints between corresponding contact pads mechanically align and secure the tiles on the substrate and provide electrical connections therebetween. Selected substrate contact pads are electrically interconnected to provide electrical connections between adjacent tiles. Each of the tiles contains a plurality of metal-filled vias that connect contact pads on the under surfaces of the tiles to electrodes on the upper surface of the tile. Alternatively, electrical connections extend around the outer peripheral surface of the tile substrate. U.S. Pat. No. 8,531,642 shows a similar wrap-around electrical connection.

EP1548571 describes a configurable and scalable tiled OLED display. The OLED materials are deposited in a passive-matrix configuration on a transparent substrate and then interconnected with solder bump technology to a printed circuit board located on top of the transparent substrate. U.S. Pat. No. 6,897,855 describes a different tiled OLED structure with display tiles having picture element (pixel) positions defined up to the edge of the tiles. Each pixel position has an organic light-emitting diode (OLED) active area that occupies approximately 25 percent of the pixel area. Each tile includes a memory that stores display data, and pixel-driving circuitry that controls the scanning and illumination of the pixels on the tile. The pixel driving circuitry is located on the back side of the tile and connections to pixel electrodes on the front side of the tile are made by vias which pass through portions of selected ones of the pixel areas that are not occupied by the active pixel material. U.S. Pat. No. 6,897,855 also describes a tiled structure that employs vias through substrates to provide the electrical connections from the driving circuitry to the pixels on the display tiles, as does U.S. Pat. No. 6,853,411. U.S. Pat. No. 6,853,411 also describes locating pixel-driving circuitry beneath an OLED light emitter. Such a structure requires additional layers in a tile structure.

In an alternative arrangement, U.S. Pat. No. 7,394,194 describes a tiled OLED structure with electrical standoffs connecting OLED electrodes on a tile substrate with conductors on a back panel. The electrical standoffs are located on the edge of each tile to avoid compromising the environmental integrity of the OLED materials on the tile.

Inorganic light-emitting diode displays using micro-LEDs (for example having an area less than 100 microns square or having an area small enough that it is not visible to an unaided observer of the display at a designed viewing distance) are also known. For example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate. U.S. Pat. No. 5,739,800 describes an LED display chip with an array of micro-LEDs mounted on a mounting substrate and electrically connected to a driver substrate. However, this arrangement requires multiple substrates and the use of vias to connect integrated circuits on the driver substrate to the LED display substrate and is not suitable for a scalable tiled structure.

Some displays use light-emitting structures on a backplane together with integrated circuits mounted on the backplane to provide control signals to the light-emitting structures. As discussed in U.S. Pat. No. 5,686,790, integrated circuits mounted on the light-emitting side of the backplane unnecessarily increase the size of the backplane while integrated circuits mounted on the side of the backplane opposite the light-emitting structures require electrical vias through the backplane or electrical leads wrapped around the edge of the backplane to electrically connect the integrated circuits with the light-emitting structures. Such vias and leads are difficult and expensive to construct. Integrated circuits located within the display area of a display reduce the resolution and aperture ratio of the display. In flat-panel displays such as LCDs and OLEDs, a reduced aperture ratio also reduces the brightness or lifetime of the display.

Multi-layer printed circuit boards (PCBs) are widely used in digital electronic systems to interconnect electronic elements such as integrated circuits and passive components such as resistors and capacitors. Such printed circuit boards include layers of insulating material interdigitated with patterned conductive layers such as etched copper sheets laminated with electrically conductive through-hole vias to interconnect the electronic elements, for example as disclosed in U.S. Pat. No. 4,591,659. However, these PCBs can be limited in the spatial resolution provided for integrated circuit electrical interconnections. Daughter cards used in conjunction with motherboards (i.e., smaller printed circuit boards mounted upon and electrically connected to larger printed circuit boards) are also known but likewise have limited spatial resolution, orientation, and integration provided for integrated circuits.

Thus there remains a need for a display tile structure that is simple to make and has increased brightness or lifetime in a robust structure for a tiled display.

SUMMARY OF THE INVENTION

The present invention provides display tile structures that can be integrated with a backplane to form a tiled display. According to embodiments of the present invention, the display tiles include inorganic light emitters, such as micro inorganic light-emitting diodes (LEDs) that are mounted to emit light in a direction opposite the backplane and that have electrodes, micro-wires, and contact pads on a side of the light emitters opposite the direction of light emission. This arrangement enables a tiled structure all of whose electrical connections are on a common side of the tile and adjacent to the backplane, so that no vias are needed through the tile layer and no wires are wrapped around the edges of the tile, thereby simplifying the structure and construction of display tiles and more readily enabling display tiles with a reduced perimeter width between the light emitters and the edge of the display tile that, in turn, can increase the resolution of the tiled display.

In contrast to the present invention, conventional inorganic LEDs, organic LEDs, and liquid crystal displays all require transparent electrodes through which light is emitted and which pass through or around the tile substrate to control the light emission, for example to provide power to the light-emitting material or liquid-crystal switching material.

In another embodiment of the invention, connections within a display tile area are enabled thereby increasing the density of the electrical interconnections to a display tile, reducing the minimum size of the display tiles, and enabling increased display resolution. Organic LEDs (OLEDs) require encapsulation layers for environmental protection that inhibit the use of connections within the display area and such interconnections obstruct light emission from the backlights of liquid crystal displays (LCDs). Furthermore, the use of small, bright emitters, for example micro-LEDs, enables a low-aperture ratio display, in contrast to OLED displays and LCDs, having increased area for interconnections between the light emitters as well as additional circuitry that enhances the functionality of the display tiles.

Furthermore, the present invention enables reduced-cost construction by providing tiles that are formed using very small components, for example micro-LEDs disposed on the tiles by micro-transfer printing, and small interconnections, for example made using photolithographic methods that enable a very high-resolution display that is then electrically connected to low-resolution contact pads electrically available to the backplane, which can then be constructed using a much lower resolution and less expensive technology, for example using parts, materials, and methods that are commonly used in printed circuit board manufacturing.

The present invention can also be made on a substrate that is subsequently removed, thereby forming a very thin structure that can be flexible. If the backplane is flexible, very large, flexible displays can be constructed.

In one aspect, the disclosed technology includes a display tile structure, the display tile structure including: a tile layer having a backplane side and an emitter side opposite the backplane side; a light emitter disposed in the tile layer and arranged to emit light from the emitter side, the light emitter having first and second electrodes for conducting electrical current to cause the light emitter to emit light; a first electrically conductive tile micro-wire electrically connected to the first electrode and a second electrically conductive tile micro-wire electrically connected to the second electrode; and a first conductive tile contact pad electrically connected to the first tile micro-wire and a second conductive tile contact pad electrically connected to the second tile micro-wire, wherein the light emitter comprises a plurality of semiconductor layers and the first and second electrodes are disposed on a common side of the semiconductor layers opposite the emitter side of the tile layer and wherein the first and second tile micro-wires and first and second tile contact pads are disposed on the backplane side of the tile layer.

In certain embodiments, the display tile structure includes a backplane having first and second backplane contact pads on a surface of the backplane and wherein the backplane side of the tile layer is adjacent to the backplane surface having the first and second backplane contact pads; and a first electrical connector electrically connecting the first tile contact pad to the first backplane contact pad and a second electrical connector electrically connecting the second tile contact pad to the second backplane contact pad.

In certain embodiments, the tile layer is a part of or forms a tile and the display tile structure includes a plurality of tiles with light emitters arranged in a regular array.

In certain embodiments, the display tile structure includes an index matching or light-absorbing layer located between the tile layers.

In certain embodiments, the tile layer comprises glass, a polymer, a curable polymer, sapphire, silicon carbide, metal, copper, or diamond.

In certain embodiments, the light emitter is an inorganic light emitting diode.

In certain embodiments, the light emitter is an inorganic light emitter having a light-emitting side and an opposed connection side adjacent to the backplane side of the tile layer and the first and second light-emitter electrodes are disposed on the connection side.

In certain embodiments, the first and second electrical connectors are metal interconnect structures, solder, solder balls, reflowed solder, anisotropic conductive films, or metal pillars.

In certain embodiments, the tiled layer is light absorbing, is a black matrix, comprises light-absorbing dyes, color-conversion materials, phosphors, single-crystal fluorophors, or nanocrystals, or comprises light-absorbing pigments, or is black.

In certain embodiments, the display tile structure includes a transparent cover affixed to or coated on the emitter side of the tile layer.

In certain embodiments, the first and second tile contact pads have a tile-contact-pad dimension over the tile layer, the first and second tile contact pads are spatially separated by a tile-contact-pad separation over the tile layer, the first and second micro-wires have a micro-wire width, the first and second electrodes have an electrode width, and the first and second electrodes are spatially separated by an electrode separation, wherein at least one of the following are true: the tile-contact-pad dimension is greater than the micro-wire width, the electrode width, or the electrode separation, or the tile-contact-pad separation is greater than the micro-wire width, the electrode width, or the electrode separation.

In certain embodiments, the backplane contact pads have a minimum dimension over the backplane that is greater than the tile-contact-pad dimension.

In certain embodiments, the display tile structure includes one or more passive electrical components mounted on to, formed on, or formed in the backplane side of the tile layer and electrically connected to the first or second micro-wires, electrodes, or contact pads.

In certain embodiments, the passive electrical components are resistors, capacitors, antennas, or inductors.

In certain embodiments, the display tile structure includes one or more active electrical components mounted on to the backplane side of the tile layer and electrically connected to the first or second micro-wires, electrodes, or contact pads.

In certain embodiments, the active electrical components are transistors, integrated circuits, power supplies, or power-conversion circuits.

In certain embodiments, at least one of the active electrical components is a driver that drives one or more of the light emitters.

In certain embodiments, the light-emitter is a red-light emitter that emits red light, and comprising a green-light emitter that emits green light and a blue-light emitter that emits blue light, each light emitter having first and second electrodes electrically connected to a tile micro-wire.

In certain embodiments, the display tile structure includes a plurality of light emitters in the tile layer.

In certain embodiments, the display tile structure includes redundant red-light, green-light, and blue-light emitters arranged to emit light from the emitter side, the redundant red, green, and blue-light emitters each light emitter having first and second electrodes electrically connected to a tile micro-wire.

In certain embodiments, the red, green, and blue light emitters form a full-color pixel in a display.

In certain embodiments, the display tile structure includes a plurality of tile contact pads spaced around the perimeter of the tile layer and at least one tile contact pad located within the interior of the tile layer.

In certain embodiments, the display tile structure includes one or more active electrical components mounted on to the backplane side of the tile layer and electrically connected to the tile contact pad located within the interior of the tile layer and wherein the plurality of tile contact pads spaced around the perimeter of the tile layer are connected to the light emitters.

In certain embodiments, the display tile structure includes a tile heat-transfer structure on or in the tile layer in thermal communication with a corresponding backplane heat-transfer structure on the backplane.

In certain embodiments, the thermal communication is a solder bond between the tile heat-transfer structure and the backplane heat-transfer structure.

In another aspect, the disclosed technology includes a tiled display including a plurality of display tile structures. The display includes a backplane having first and second backplane contact pads on a surface of the backplane and the backplane side of the tile layer is adjacent to the backplane surface having the first and second backplane contact pads; and a first electrical connector electrically connecting the first tile contact pad to the first backplane contact pad and a second electrical connector electrically connecting the second tile contact pad to the second backplane contact pad.

In another aspect, the disclosed technology includes a method of making a display tile, the method including: providing a substrate having a structure side; disposing one or more light emitters on the structure side of the substrate, each light emitter having a light-emitting side adjacent to the structure side to emit light through the substrate and an opposed connection side with electrodes for providing electrical power to the light emitter to cause the light emitter to emit light; forming a tile layer on or over the light emitters and structure side of the substrate and exposing the electrodes, the tile layer having an emitter side adjacent to the structure side of the substrate and a backplane side opposite the emitter side; forming tile micro-wires on or in the backplane side of the tile layer, the tile micro-wires electrically connected to the electrodes; and forming tile contact pads on or in the backplane side of the tile layer, the tile contact pads electrically connected to the tile micro-wires.

In certain embodiments, the method includes providing a backplane having backplane contact pads on a backplane surface of the backplane; disposing the backplane side of the tile layer adjacent to the backplane surface so that the backplane contact pads are in correspondence with the tile contact pads; and electrically connecting the tile contact pads to the backplane contact pads with electrical connectors.

In certain embodiments, the method includes forming a tile heat-transfer structure on the tile layer, forming a backplane heat-transfer structure on the backplane, and thermally connecting the tile heat-transfer structure to the backplane heat-transfer structure.

In certain embodiments, the method includes providing a plurality of display tiles electrically connected to the backplane to form a display.

In certain embodiments, the method includes removing the substrate from the emitter side of the tile layer and from the one or more light emitters.

In certain embodiments, the method includes providing a plurality of light emitters and cutting the tile layer into portions that each comprise one or more light emitters, tile micro-wires, and tile contact pads.

In certain embodiments, the method includes forming the tile layer of a curable materials, curing the material, and forming vias through at least a portion of the cured materials to expose the electrodes.

In certain embodiments, the cured material is light absorbing, is a black matrix, comprises light-absorbing dyes, comprises light-absorbing pigments, or is black.

In certain embodiments, the method includes disposing active or passive electrical components on or over the tile layer and electrically connecting electrical components to the tile micro-wires, tile contact pads, or electrodes.

The present invention provides a display tile structure and tiled display having increased resolution, reduced thickness, improved functionality, and reduced manufacturing cost.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which.

Figure 1:
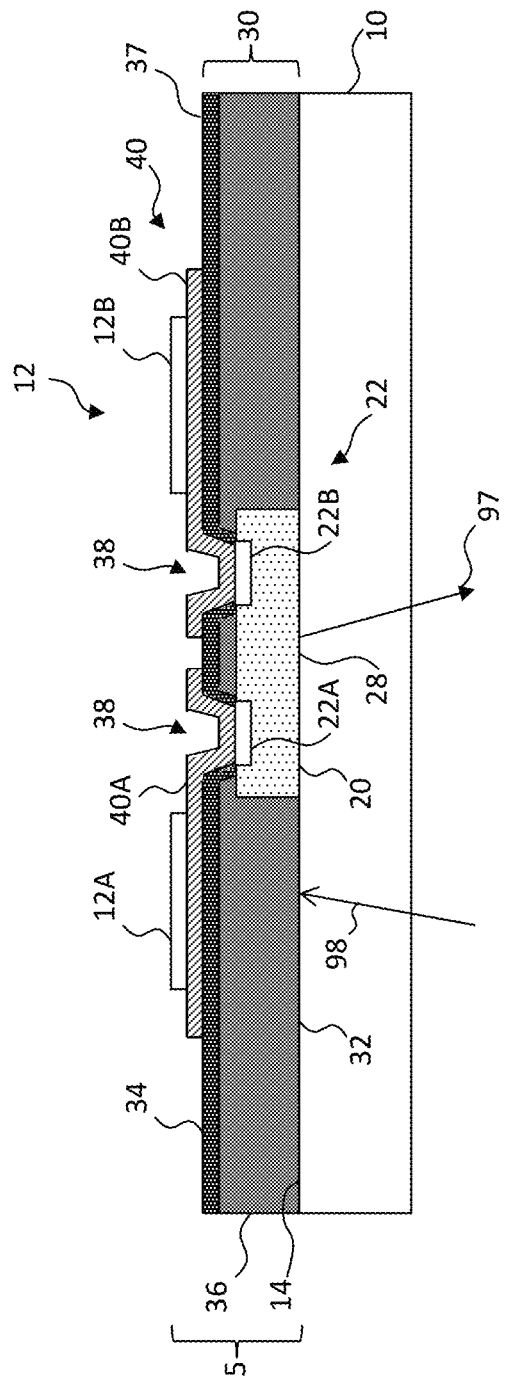
FIG. 1 is a cross section of an embodiment of the present invention.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF THE INVENTION

Figure 2:
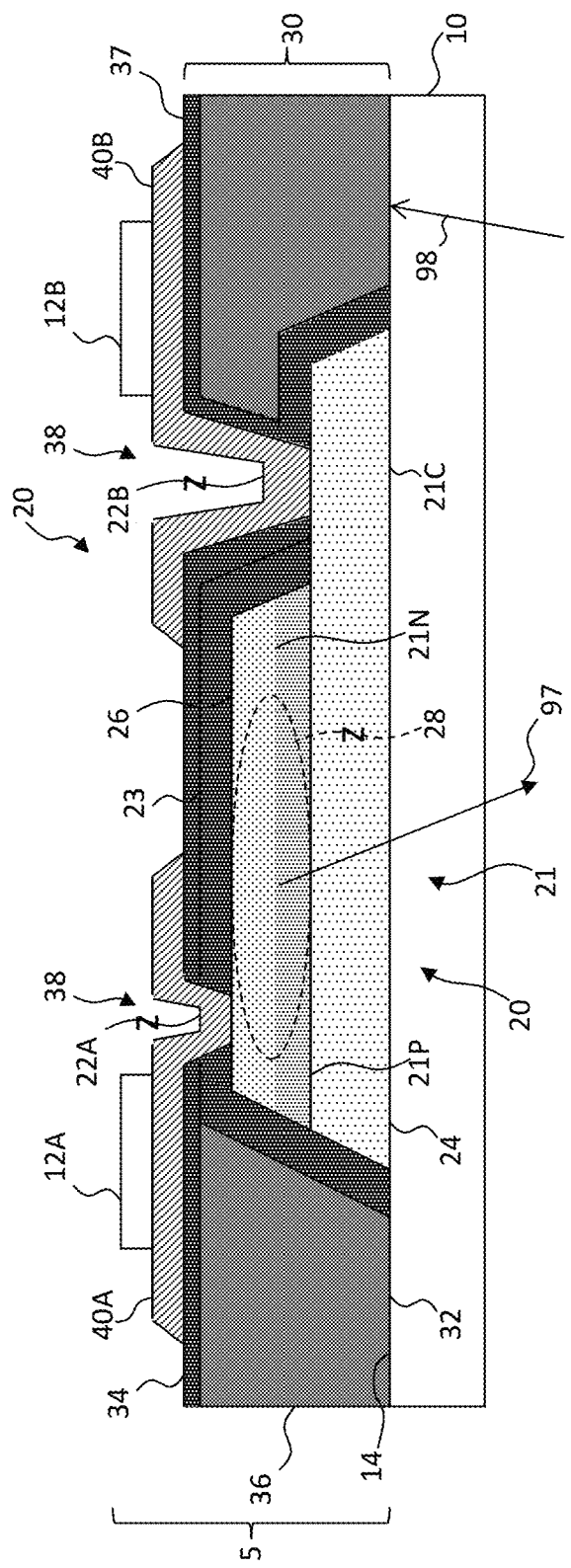
FIG. 2 is a detail cross section of a light emitter according to an embodiment of the present invention.

Referring to the cross section of FIG. 1 and the detailed cross section of FIG. 2, in an embodiment of the present invention a display tile structure 5 includes a tile layer 30 having a backplane side 34 and an emitter side 32 opposite the backplane side 34. The tile layer 30 can include or be a light-absorbing material 36 and can include sub-layers such as a dielectric layer 37, particularly if the tile layer 30 is at least partially electrically conductive. The dielectric layer 37 can be an interlayer dielectric. A light emitter 20 is disposed in the tile layer 30 and arranged to emit light 97 from a light-emitting area 28 on the emitter side 32 of the tile layer 30. The light emitter 20 has first and second electrodes 22A, 22B, collectively referred to as electrodes 22, for conducting electrical current to cause the light emitter 20 to emit light 97. The first and second electrodes 22A, 22B can also be considered to be first and second light-emitter contact pads for the light emitter 20. The light emitter 20 can be a light-emitting diode, for example an inorganic light-emitting diode (LED) or a micro-LED.

A first electrically conductive tile micro-wire 40A is electrically connected to the first electrode 22A and a second electrically conductive tile micro-wire 40B is electrically connected to the second electrode 22B. A first electrically conductive tile contact pad 12A is electrically connected to the first tile micro-wire 40A and a second electrically conductive tile contact pad 12B is electrically connected to the second tile micro-wire 40B. The first and second tile micro-wires 40A and 40B are collectively referred to as tile micro-wires 40 and the first and second tile contact pads 12A and 12B are collectively referred to as tile contact pads 12. The first and second tile micro-wires 40A, 40B and the first and second tile contact pads 12A, 12B are disposed on the backplane side 34 of the tile layer 30 and, optionally, are electrically insulated from the light-absorbing material 36 and the light emitter 20 by the dielectric sub-layer 37. The first and second tile micro-wires 40A, 40B and the first and second tile contact pads 12A, 12B can be at least partially within the tile layer 30 as well as on or over the backplane side 34 of the tile layer 30. For example the electrodes 20 can be accessible through vias 38 that extend into and only partially through the tile layer 30. In certain embodiments, the first and second tile contact pads 12A, 12B must be accessible from the backplane side 34. In an embodiment, neither the tile micro-wires 40 nor the electrodes 22 are formed, located, or disposed on the emitter side 32 of the tile layer 30 so that no vias 38 through the tile layer 30 need be constructed. In particular, the tile layer 30 is at least partly between the tile micro-wires 40 and the emitter side 32 and at least partly between the tile contact pads 12 and the emitter side 32, so that ambient light 98 incident on the emitter side 32 of the tile layer 30 is at least partially absorbed and is at least partially not reflected from either of the tile contact pads 12 or the tile micro-wires 40.

Referring specifically to the detailed cross section of FIG. 2, in an embodiment of the present invention the light emitter 20 includes a plurality of semiconductor layers 21N, 21P, 21C (collectively semiconductor layers 21). The semiconductor layer 21N can be an n-doped semiconductor layer 21N, the semiconductor layer 21P can be a p-doped semiconductor layer 21P, and the semiconductor layer 21C can be a conductive semiconductor layer 21C optimized for transparency and conductivity and intended to conduct electrical current from the n- and p-doped semiconductor layers 21N, 21P to the second tile contact pad 12B through the second electrode 22B and second tile micro-wires 40B. The n-doped semiconductor layer 21N is electrically connected to the first tile contact pad 12A through the first electrode 22A and the first tile micro-wires 40A. The first and second electrodes 22A, 22B are disposed on a common side of the semiconductor layers 21 opposite the emitter side 32 and adjacent to the backplane side 34 of the tile layer 30. The electrodes 22 are electrically insulated from the semiconductor layers 21 by the dielectric layer 23 through which the vias 38 are formed to make electrical contact between the conductive semiconductor layer 21C and the n-doped semiconductor layer 21N. The light emitter 20 has a light-emitting side 24 coincident with the emitter side 32 of the tile layer 30 and a connection side 26 on which the first and second electrodes 22A, 22B are connected, although not necessarily in the same plane. The connection side 26 is adjacent to the backplane side 34 of the tile layer 30, although they are not necessarily coincident since the connection side 26 of the light emitter 20 can be partially covered with the light-absorbing material 36 of the tile layer 30. The first and second electrodes 22A, 22B are disposed on the connection side 26. In an embodiment, the light emitter 20 extends through, substantially through, mostly through, or at least partially through the tile layer 30. In an embodiment, the first and second tile micro-wires 40A, 40B and first and second tile contact pads 12A, 12B are disposed exclusively on the backplane side 34 of the tile layer 30.

In operation, an electrical voltage difference is provided across the tile contact pads 12 causing electrical current to flow through the tile micro-wires 40 and the electrodes 22 to the semiconductor layers 21N, 21P, 21C. Current flows through the n-doped semiconductor layer 21N and through the conductive semiconductor layer 21C to the p-doped semiconductor layer 21P where the electrons and holes combine to emit light from the light-emitting area 28 to emit light 97. Because the light-absorbing material 36 of the tile layer 30 absorbs ambient light 98 and because there are no reflective tile contact pads 12 or tile micro-wires 40 on the emitter side 32 of the tile layer 30, there is good contrast between the emitted light 97 and other ambient light 98.

The present invention, in certain embodiments, provides a display tile structure 5 without vias through the tile layer 30 and does not require transparent electrodes, for example indium tin oxide, through which light is emitted, and from which ambient light can be reflected. Transparent metal oxides, such as indium tin oxide, are not completely transparent, for example less than 90% transparent, and tend to be colored, for example yellow. Thus, by avoiding the use of such transparent conductors, the display tile structure 5 of the present invention increases light output and improves color. Furthermore by avoiding vias through the tile layer 30, costs and processing steps are reduced.

As shown in FIGS. 1 and 2, tile substrate 10 includes a substrate structure side 14 on which the display tile structure 5 can be disposed, constructed, or formed. In an embodiment, the display tile structure 5 is removably adhered or attached to the tile substrate 10.

Figure 3:
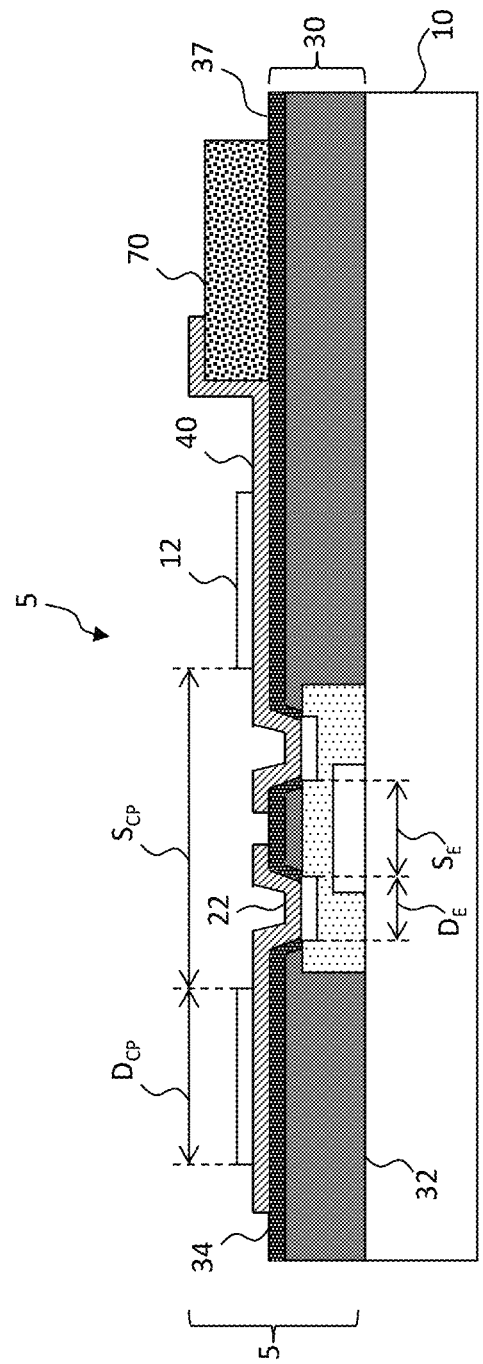
FIG. 3 is a cross section of an embodiment of the present invention including an electronic component.

Referring next to FIG. 3, the display tile structure 5 of the present invention, in certain embodiments, can include one or more electrical components 70 mounted or formed on or in the backplane side 34 of the tile layer 30 that are electrically connected to the tile micro-wires 40, electrodes 22, or tile contact pads 12. In one embodiment, the electrical components 70 are passive electrical components such as resistors, capacitors, antennas, or inductors. In another embodiment, the electrical components 70 include active electrical components such as transistors, integrated circuits, power supplies, or power-conversion circuits. In a further embodiment, at least one of the active electrical components 70 is a driver or controller that drives or controls one or more of the light emitters 20, for example an inorganic LED control circuit.

As shown in FIG. 3, the first and second tile contact pads 12 have a tile-contact-pad dimension $D_{CP}$ and are spatially separated by a tile-contact-pad separation $S_{CP}$ over the tile layer 30. The tile micro-wires 40 have a micro-wire width (not shown in the cross section of FIG. 3 but is the width of the tile micro-wires 40 over the tile layer 30). The electrodes 22 have an electrode width $D_E$ and are spatially separated by an electrode separation $S_E$. In an embodiment, the tile-contact-pad dimension $D_{CP}$ is greater than the micro-wire width, the electrode width $D_E$, or the electrode separation $S_E$. Alternatively or in addition to, the tile-contact-pad separation $S_{CP}$ is greater than the micro-wire width, the electrode width $D_E$, or the electrode separation $S_E$. By constructing these elements within the sizes specified, shorts between the tile contact pads 12, tile micro-wires 40, or electrodes 22 are reduced and a lower-resolution patterning process can be used to form the display tile structure 5 of the present invention.

Figure 4:
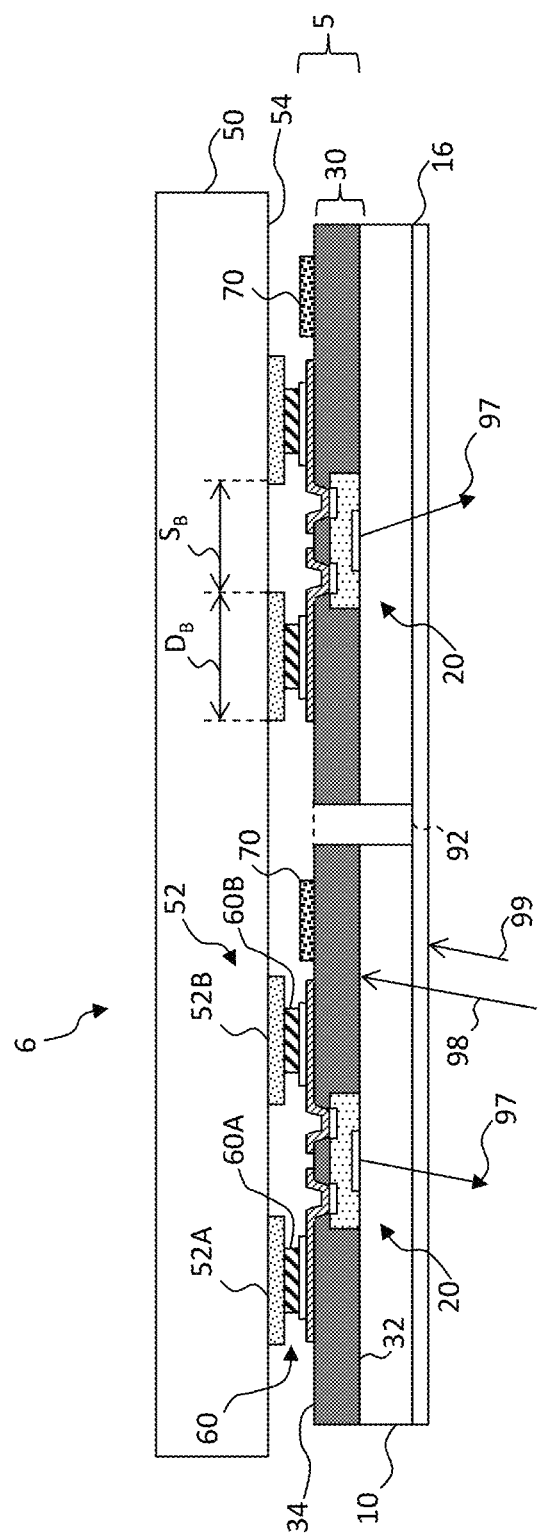
FIG. 4 is a cross section of another embodiment of the present invention including a backplane.

In a further embodiment of the present invention, referring to FIG. 4, a tiled display 6 includes a plurality of display tile structures 5. Each display tile structure 5 can be an individual tile 5 (e.g., even if the tile 5 does not include the tile substrate 10) in the tiled display 6 and each tile 5 includes a separate tile layer 30 with one or more light emitters 20. The tiles 5 are affixed to a backplane 50 having first and second backplane contact pads 52A, 52B (collectively 52) on a backplane surface 54 of the backplane 50. The backplane side 34 of the tile layer 30 of each tile 5 is adjacent to the backplane surface 54 having the first and second backplane contact pads 52A, 52B. A first electrical connector 60A electrically connects the first tile contact pad 12A to the first backplane contact pad 52A and a second electrical connector 60B electrically connects the second tile contact pad 12B to the second backplane contact pad 52B. When a voltage difference is supplied across the first and second backplane contact pads 52A, 52B, current flows through the first and second electrical connectors 60A, 60B (collectively electrical connectors 60) into the light emitters 20 to cause the light emitters 20 to emit light 97.

As shown in FIG. 4, in a further embodiment, the tiled display 6 includes a plurality of tiles 5 having tile layers 30 each with one or more light emitters 20 arranged in a regular array. An index-matching material 92 or a light-absorbing layer can be located between the tile layers 30. For example, the index-matching material 92 can be matched to the tile substrate 10 to reduce reflections or refractions of ambient light. Moreover, as shown in FIG. 4, the tile layer 30 and an anti-reflection layer 16 coated on the tile substrate 10 absorb ambient light 98, 99, thereby improving tiled display 6 contrast.

The backplane contact pads 52 can have a minimum backplane-contact-pad dimension $D_B$ over the backplane 50 that is greater than the tile-contact-pad dimension $D_{CP}$. Alternatively or in addition, the backplane-contact-pad separation $S_B$ is greater than the tile-contact-pad separation $S_{CP}$. These dimensions help to ensure that the backplane contact pads 52 are not shorted together by the tile contact pads 12, in the case of misalignment between the backplane 50 and the tiles 5.

Figure 5:
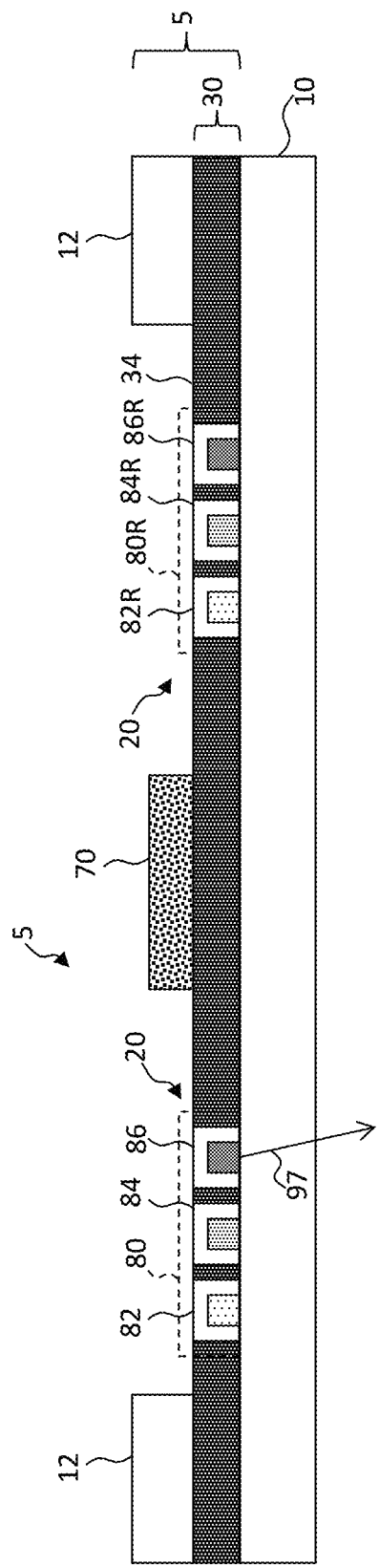
FIG. 5 is a cross section of an embodiment of the present invention including redundant light emitters.

Referring to FIG. 5, in a further embodiment of the present invention, the light-emitter 20 can be a red-light emitter 82, a green-light emitter 84, or a blue-light emitter 86, or other color light emitter 20 (for example yellow or cyan). Moreover, in an embodiment, the display tile structure 5 can include a red-light emitter 82, a green-light emitter 84, and a blue-light emitter 86, and another color light emitter 20 (for example yellow or cyan). Each tile layer 30 has a corresponding plurality of light emitters 20 that each has electrodes 22 electrically connected to tile micro-wires 40, respectively. The plurality of light emitters 20 can therefore be arranged to form full-color pixels 80 in the tiled display 6.

In a further embodiment of the present invention, some of the plurality of light emitters 20 can be redundant light emitters 20 forming a redundant full-color pixel 80R, for example redundant red-light emitters 82R, redundant green-light emitters 84R, or redundant blue-light emitters 86R, arranged to emit light 97 from the emitter side 32 of the tile layer 30. The redundant red-, green-, and blue-light emitters 82R, 84R, 86R each have electrodes 22 electrically connected to a tile micro-wire 40, respectively (FIG. 1). Redundant light emitters 20 can be disposed on a common tile substrate 10 (as shown in FIG. 5) or on a separate tile substrate 10 and can be controlled with a common electrical component 70 or a separate electrical component 70.

Figure 6:
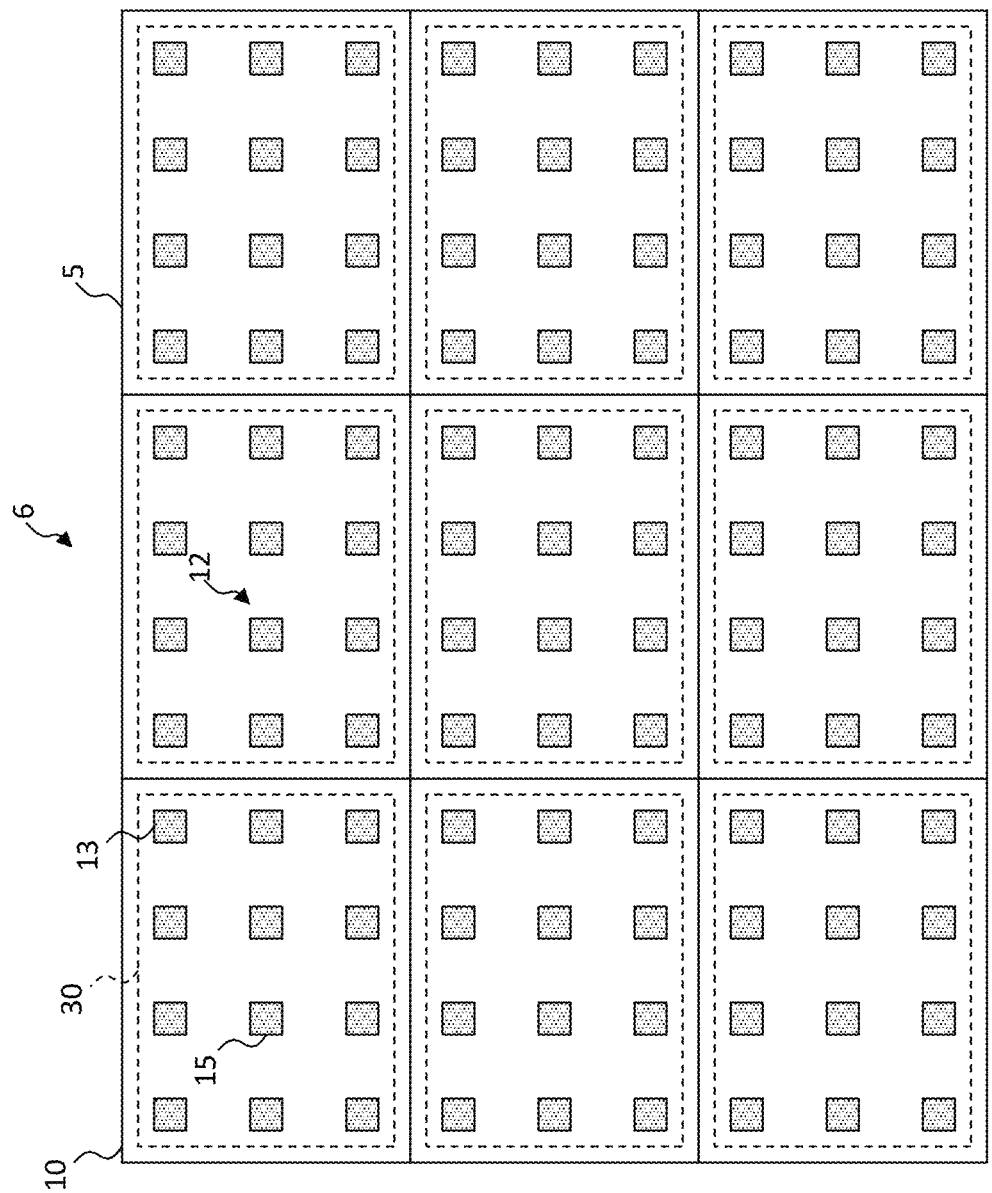
FIG. 6 is a plan view of an embodiment of the present invention including light emitters arranged in an array.

Referring to FIG. 6, the tiled display 6 of the present invention can include a plurality of tiles 5. Each of the tiles 5 can have a plurality of tile contact pads 12. The tile contact pads 12 include perimeter tile contact pads 13 spaced around the perimeter of the tile layer 30 and can include at least one interior tile contact pad 15 located within the interior of the tile layer 30. An interior tile contact pad 15 is a tile contact pad 12 for which a perimeter tile contact pad 13 is closer to an edge of the tile layer 30 than the interior tile contact pad 15 in any direction. By arranging the tile contact pads 12 with both interior and perimeter tile contact pads 15, 13, for example in a two-dimensional arrangement as shown, the tile contact pads 12 are spatially more densely arranged than if the contact pads are located around the tile perimeter, reducing the area needed to interconnect tiles 5 to the backplane 50. In an arrangement, one or more active electrical components 70 mounted on to the backplane side 34 of the tile layer 30 (FIG. 5) is electrically connected to an interior tile contact pad 15 and the plurality of perimeter tile contact pads 13 are connected to the light emitters. This arrangement provides a useful and efficient wiring layout and the tiles and light emitters 20 can be spaced over the backplane 50 in a regular array at low cost.

Figure 7:
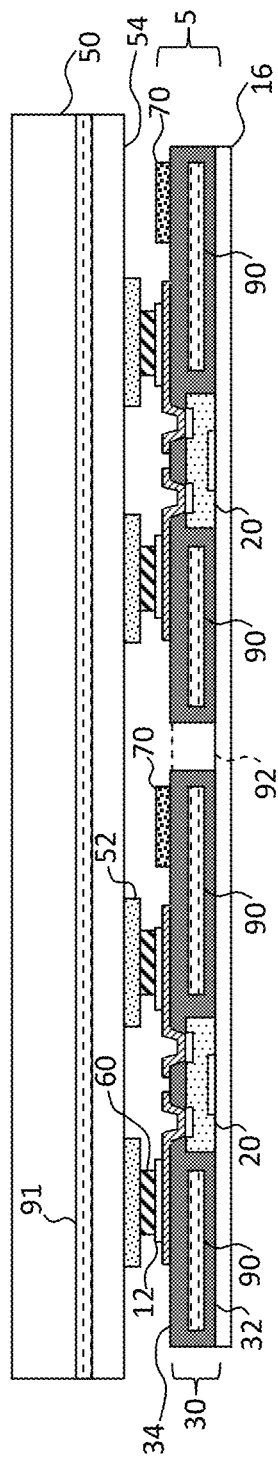
FIG. 7 is a cross section of another embodiment of the present invention including heat-spreading layers.

As shown in FIG. 7, in another embodiment of the invention, the display tile structure 5 includes a tile heat-transfer structure 90, for example a heat-spreading layer, on or in the tile layer 30 and, for example, including metal, silicon carbide, or carbon. The tile heat-transfer structure 90 is in thermal communication with a corresponding backplane heat-transfer structure 91 on the backplane 50. The tile heat-transfer structure 90 does not have to be in physical contact with the backplane heat-transfer structure 91 so long as heat generated on the tile 5, for example by the light emitters 20, is transferred and distributed to the backplane 50, thereby reducing the temperature and temperature variability of the light emitters 20 and improving their lifetime and output uniformity. In an embodiment, the thermal communication is at least partly through the electrical connectors 60 and can be, for example, a solder bond or an anisotropic conductive film between the tile contact pads 12 of the tile 5 and the backplane contact pads 52 of the backplane 50.

In various embodiments of the present invention, the tile layer 30 includes glass, a polymer, a curable polymer, sapphire, silicon carbide, copper or diamond, or a high thermal conductivity material. The curable polymer can be light absorbing, black or impregnated with or include light-absorbing particles or pigments, such as carbon black or light-absorbing dyes or include color-conversion materials, phosphors, single-crystal fluorophors, or nanocrystals. The tile layer 30 can be a black matrix. Such materials can be coated, for example by spray, curtain, or spin coating, cured with heat or electromagnetic radiation, and patterned using photolithographic methods.

The electrodes 22, tile micro-wires 40, or tile contact pads 12 can be metal, for example aluminum, silver, gold, tantalum, tungsten, titanium, or include metals or metal alloys, conductive metal oxides, or conductive inks having conductive particles. Deposition and patterning methods, for example using evaporative coating and photolithography, or inkjet deposition and curing can be used to form the electrodes 22, micro-wires 40, and tile contact pads 12. The same or different methods may be used to form the electrodes 22, micro-wires 40, and tile contact pads 12.

The electrical connectors 60 can be metal interconnect structures, solder, solder balls, reflowed solder, anisotropic conductive film (ACF), metal pillars, pins (e.g., similar to integrated circuit pins), or connector pins (e.g., as used in the printed-circuit board industry).

The tile substrate 10 can be glass, plastic, polymer, metal or any material that provides a suitable surface (e.g., on the substrate structure side 14) for disposing, making, or forming the elements of the display tile structure 5. The tile substrate 10 can be flexible or rigid. Backplanes 50 can be printed circuit boards, for example including glass, ceramic, epoxy, resin, or polymer and can be made in a layered structure with conductive traces as are known in the printed-circuit board industry. The backplane 50 can be rigid or flexible. The tiles 5 can be connected to the backplane 50 with soldered connections, using surface mount structures and techniques, or using connectors and plugging the tiles into backplane connectors. The tiled display 6 can be flexible or rigid.

In one embodiment of the present invention, the light emitters 20 are formed on a native semiconductor wafer (e.g., GaN) and then disposed on the tile substrate 10 using micro transfer printing. For example, U.S. Pat. No. 8,722,458 entitled Optical Systems Fabricated by Printing-Based Assembly teaches transferring light-emitting, light-sensing, or light-collecting semiconductor elements from a wafer substrate to a destination substrate. Additional details useful in understanding and performing aspects of the present invention are described in U.S. patent application Ser. No. 14/743,981, filed Jun. 18, 2015 and entitled Micro-Assembled Micro LED Displays and Lighting Elements. Furthermore, the structure of the tiled display 6 of the present invention can be formed using micro-transfer techniques, for example using a multi-step transfer or assembly process. By employing such a multi-step transfer or assembly process, increased yields are achieved and thus reduced costs. A discussion of compound micro-assembly structures and methods is provided in U.S. Patent Application Ser. No. 62/055,472 filed Sep. 25, 2014, entitled Compound Micro-Assembly Strategies and Devices.

Figure 8:
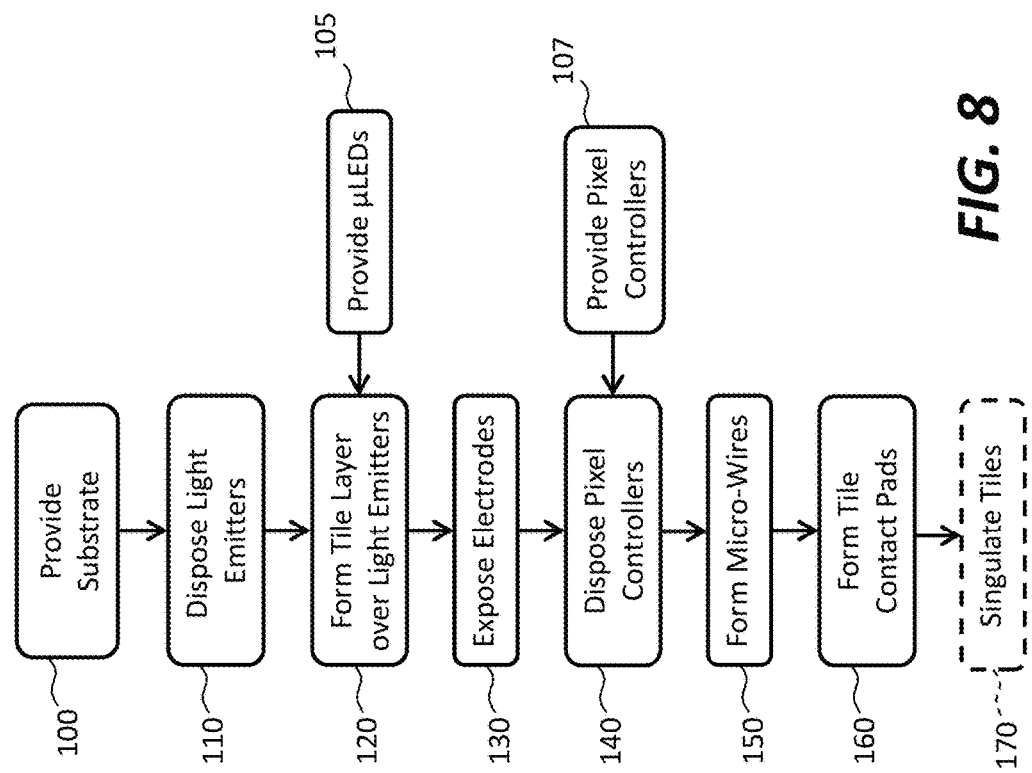

Referring to the flow diagram of FIG. 8, a method of the present invention includes providing a substrate (e.g., tile substrate 10 having a substrate structure side 14) in step 100, providing light emitters 20 such as micro-LEDs in step 105, and providing pixel controllers, such as active integrated circuit electrical components 70, in step 107. In step 110, one or more light emitters 20 are disposed on the structure side 14 of the tile substrate 10, for example by micro transfer printing, so that each light emitter 20 has a light-emitting side 24 adjacent to the structure side 14 and an opposed connection side 26 with electrodes 22 for providing electrical power to the light emitter 20 to cause the light emitter 20 to emit light 97 from the light-emitting side 24 of the light emitter 20 through the tile substrate 10.

In step 120, a tile layer 30 is formed on or over the light emitters 20 and structure side 14 of the tile substrate 10. The tile layer 30 has an emitter side 32 adjacent to the substrate structure side 14 of the tile substrate 10 and a backplane side 34 opposite the emitter side 32. The electrodes 22 are exposed in step 130, for example by pattern-wise exposing a curable light-absorbent material 36 of the tile layer 30 and developing the light-absorbent material 36 to form vias 38. Optionally, the pixel controller (e.g., an active electrical component 70) provided in step 170 is disposed on the tile layer 30 in step 140, for example by micro-transfer printing. Tile micro-wires 40 are formed in step 150 on or in the backplane side 34 of the tile layer 30 and electrically connected to the electrodes 22, for example using photo-lithographic processes to pattern a deposited blanket of electrically conductive metal, for example aluminum or silver, or materials including metal. Tile contact pads 12, are formed in step 160 to electrically connect to the tile micro-wires 40. The tile micro-wires 40 and the tile contact pads 12 can be formed exclusively on the backplane side 34 or in, or partially in, the backplane side 34 of the tile layer 30 so that no tile micro-wire 40 or tile contact pad 12 is in contact with the substrate structure side 14 of the tile substrate 10. In an embodiment, the tile micro-wires 40 and tile contact pads 12 are formed in a common step with common materials so that steps 150 and 160 are the same step. Furthermore, if electrical components 70 are present, they can be electrically connected to the tile micro-wires 40, tile contact pads 12, or electrodes 22 in the same step. In an embodiment, the tile substrate 10 is a large substrate and multiple display tile structures 5 are formed on the display tile substrate 10 at the same time with the same materials and with the same steps. The multiple display tile structures 5 can be singulated into portions that each include one or more light emitters 20, tile micro-wires 40, and tile contact pads 12 to provide individual display tile structures 5 or groups of display tile structures 5 on a common substrate in optional step 170.

Figure 9:
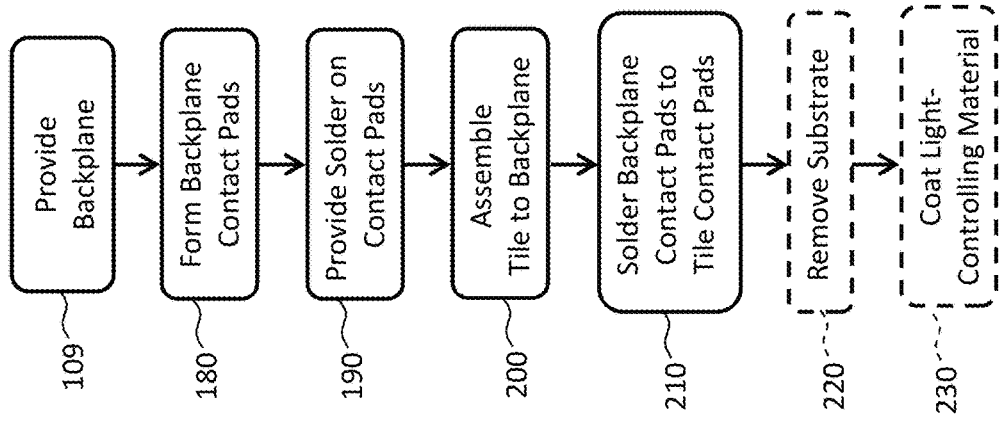
FIGS. 8-9 are flow charts illustrating methods of the present invention.

Referring to the flow diagram of FIG. 9, a backplane 50 is provided in step 109, for example a printed circuit board, and backplane contact pads 52 formed in step 180 on a backplane surface 54 of the backplane 50, for example using conventional printed circuit board materials and manufacturing methods such as plated or etched copper. In step 190, solder is provided on the tile contact pads 12 or the backplane contact pads 52 (providing electrical connectors 60), the tiles 5 are assembled to the backplane 50 in step 200, thereby disposing the backplane side 34 of the tile layer 30 adjacent to the backplane surface 54 so that the backplane contact pads 52 are located in spatial correspondence with the tile contact pads 12, and the assembled structure is processed, for example with heat in step 210, to adhere and electrically connect the tile contact pads 12 to the backplane contact pads 52 with electrical connectors 60 and form the tiled display 6. This processing step can also align the tiles 5, for example using surface tension effects from the tile contact pads 12 and the backplane contact pads 52 with melted solder. Alternatively, tiles 5 can be plugged into sockets or connectors to electrically connect and align the backplane contact pads 52 to the tile contact pads 12. In an optional step, and as shown in FIG. 7, the tile substrate 10 is removed in step 220 from the emitter side 32 of the tile layer 30 and the light-emitting side 24 of the light emitters 20. To enable removal, a release layer or light adhesive can be included in the tile substrate 10 on which the light emitters 20 are disposed and the light-absorbing material 36 coated. A protective layer 18, structure, light-controlling layer, diffuser, or light-extraction layer can be formed over the exposed emitter side 32 of the tile layer 30 and the light-emitting side 24 of the light emitters 20. Alternatively or in addition, an index-matching material 92 or light-absorbing material 36 can be disposed in any gaps between the tiles 5, for example by coating a light-controlling material in step 230. Anti-reflection layers 16 (FIG. 4) can also be used. By removing the tile substrate 10, a thinner or more flexible tiled display 6 is formed.

In a further embodiment, a tile heat-transfer structure 90 is formed on or in the tile layer 30. A backplane heat-transfer structure 91 is formed on the backplane 50 and thermally connected to the tile heat-transfer structure 90.

The present invention provides a simple, inexpensive, and robust way to construct a display tile structure 5 and tiled display 6. The invention reduces process steps and provides a simple and robust light output structure well suited to micro transfer printing of micro-LED light emitters useful in making large, high-resolution displays. The structure described is not suitable to organic light emitting diode (OLED) or liquid crystal (LC) displays since those display structures employ vertical electrode structures that require transparent conductors (for example transparent conductive oxides) electrically connected through vias constructed through substrates, around the edges of substrates, or are connected on both sides of a substrate, all of which compromise the utility or integrity of the device and are problematic for environmentally sensitive materials, and add cost. In particular, OLED and LC displays require electrical connections to the light-emitting side 24 of the display device. Furthermore, OLED and LC materials require environmental protection and sealed structure not needed for the present invention. The present invention also enables bottom emission (if the tile substrate 10 is present), which is not possible in LC displays because of the backlight. In another embodiment (e.g., as illustrated in FIG. 7) no conventional substrate is present at all in the assembled display, thus improving light output and reducing thickness. Furthermore, the present invention provides structures that locate circuitry connections or integrated circuits that are present in or behind the display area, further improving component density and display resolution and improving utility and functionality.

As is understood by those skilled in the art, the terms "over" and "under" are relative terms and can be interchanged in reference to different orientations of the layers, elements, and substrates included in the present invention. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the invention should not be limited to the described embodiment, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as the disclosed technology remains operable. Moreover, two or more steps or actions in some circumstances can be conducted simultaneously. The invention has been described in detail with particular reference to certain embodiments thereof, but it will be understood that variations and modifications can be effected within the spirit and scope of the invention.

PARTS LIST $D_B$ backplane-contact-pad dimension
$D_{CP}$ tile-contact-pad dimension
$D_E$ electrode width
$S_B$ backplane-contact-pad separation
$S_{CP}$ tile-contact-pad separation
$S_E$ electrode separation
5 display tile structure/tile
6 tiled display
10 tile substrate
12 tile contact pad
12A first tile contact pad
12B second tile contact pad
13 perimeter tile contact pad
14 substrate structure side
15 interior tile contact pad
16 anti-reflection layer
18 protective layer
20 light emitter
21 semiconductor layers
21C conductive semiconductor layer
21P p-doped semiconductor layer
21N n-doped semiconductor layer
22 light-emitter contact pad/electrode
22A first light-emitter contact pad/first electrode
22B second light-emitter contact pad/second electrode
23 dielectric layer
24 light-emitting side
26 connection side
28 light-emitting area
30 tile layer
32 emitter side
34 backplane side
36 light-absorbing material
37 dielectric sub-layer/interlayer dielectric
38 via
40 tile micro-wire
40A first tile micro-wire
40B second tile micro-wire
50 backplane
52 backplane contact pads
52A first backplane contact pad
52B second backplane contact pad
60 backplane surface
60 electrical connector
60A first electrical connector
60B second electrical connector
70 electrical component
80 full-color pixel
80R redundant pixel
82 red-light emitter
82R redundant red-light emitter
84 green-light emitter
84R redundant green-light emitter
86 blue-light emitter
86R redundant blue-light emitter
90 tile heat-transfer structure
91 backplane heat-transfer structure
92 index-matching material
97 emitted light
98 ambient light
99 ambient light
100 provide substrate step
105 provide light emitters step
107 provide pixel controller step
109 provide backplane step
110 dispose light emitters step
120 form tile layer over light emitters step
130 expose electrodes step
140 dispose pixel controller step
150 form micro-wires step
160 form tile contact pads step
170 singulate tiles step
180 form backplane contact pads step
190 provide solder on contact pads step
200 assemble tile to backplane step
210 solder backplane contact pads to tile contact pads step
220 remove substrate step
230 coat light-controlling material step

The invention claimed is:
1. A method of making a display tile, comprising:
providing a tile substrate having a structure side;
disposing one or more light-emitting diodes (LEDs) on and in direct contact with the structure side of the tile substrate, each LED having a light-emitting side adjacent to the structure side to emit light through the tile substrate and an opposed connection side with first and second electrodes for providing electrical power to the LED to cause the LED to emit light;
forming a tile layer on or over the one or more LEDs and structure side of the tile substrate and exposing the first and second electrodes, the tile layer having an emitter side adjacent to the structure side of the tile substrate and a backplane side opposite the emitter side, the tile layer including a layer of light-absorbing material disposed in the tile layer on and in direct contact with the tile substrate and only partially encapsulating the one or more LEDs;
forming an electrically conductive first tile micro-wire electrically connected to the first electrode and an electrically conductive second tile micro-wire electrically connected to the second electrode, the first and second tile micro-wires disposed only on a side of the layer of light-absorbing material opposite the tile substrate and the first and second tile micro-wires not extending to the edges of the tile substrate; and
forming an exposed conductive first tile contact pad electrically connected to the first tile micro-wire and an exposed conductive second tile contact pad electrically connected to the second tile micro-wire, wherein the one or more LEDs comprise a plurality of semiconductor layers and the first and second electrodes are disposed on a common side of the plurality of semiconductor layers opposite the emitter side of the tile layer and wherein the first and second tile micro-wires and first and second tile contact pads are disposed only on a side of the layer of light-absorbing material opposite the tile substrate on the backplane side of the tile layer, and the first and second tile contact pads disposed on a portion of the first and second tile micro-wires that are in contact with the layer of light-absorbing material.

2. The method of claim 1, comprising:
providing a backplane having backplane contact pads on a backplane surface of the backplane;
disposing the backplane side of the tile layer adjacent to the backplane surface so that the backplane contact pads are in correspondence with the first tile and second tile contact pads; and
electrically connecting the tile contact pads to the backplane contact pads with electrical connectors.

3. The method of claim 2, comprising forming a tile heat-transfer structure on the tile layer, forming a backplane heat-transfer structure on the backplane, and thermally connecting the tile heat-transfer structure to the backplane heat-transfer structure.

4. The method of claim 2, comprising providing a plurality of display tiles electrically connected to the backplane to form a display.

5. The method of claim 2, comprising removing the tile substrate from the emitter side of the tile layer and from the one or more LEDs.

6. The method of claim 1, comprising providing a plurality of LEDs and cutting the tile layer into portions that each comprise respective one or more LEDs, respective first and second tile micro-wires, and respective first and second tile contact pads.

7. The method of claim 1, comprising forming the tile layer of a curable material, curing the curable material, and forming vias through at least a portion of the cured material to expose the first and second electrodes.

8. The method of claim 7, wherein the cured material is light absorbing, is a black matrix, comprises light-absorbing dyes, comprises light-absorbing pigments, or is black.

9. The method of claim 1, comprising disposing active or passive electrical components on or over the tile layer and electrically connecting the active or passive electrical components to the first and second tile micro-wires, the first and second tile contact pads, or the first and second electrodes.

10. The method of claim 1, comprising providing one or more active electrical components mounted on to the backplane side of the tile layer on a side of the layer of light-absorbing material opposite the tile substrate and electrically connected to the first or second tile micro-wires, electrodes, or tile contact pads and wherein at least one of the first or second tile micro-wires is electrically connected to the first tile contact pad or the second tile contact pad through one or more of the active electrical components.

11. The method of claim 10, wherein the active electrical components are transistors, integrated circuits, power supplies, or power-conversion circuits.

12. The method of claim 10, wherein at least one of the active electrical components is a driver that drives one or more of the LEDs.

13. The method of claim 1, comprising providing redundant red-light, green-light, and blue-light emitters arranged to emit light from the emitter side, the redundant red, green, and blue-light emitters each having respective first and second electrodes electrically connected to the first and second tile micro-wires, respectively.

14. The method of claim 1, wherein the one or more LEDs include a red-light emitter that emits red light, a green-light emitter that emits green light, and a blue-light emitter that emits blue light, each light emitter having the first and second electrodes electrically connected to the first and second tile micro-wires, respectively.

15. The method of claim 14, wherein the red, green, and blue light emitters form a full-color pixel in a display.

16. The method of claim 1, wherein the tile layer is a black matrix, comprises light-absorbing dyes, color-conversion materials, phosphors, single-crystal fluorophores, or nanocrystals, or comprises light-absorbing pigments, or is black.

17. The method of claim 1, comprising providing a transparent cover affixed to or coated on the emitter side of the tile layer.

18. The method of claim 1, wherein disposing the one or more LEDs on and in direct contact with the structure side of the tile substrate comprises micro-transfer printing the one or more LEDs onto the structure side of the tile substrate.

19. The method of claim 18, comprising providing the layer of light-absorbing material disposed in the tile layer on and in direct contact with the tile substrate and only partially encapsulating the one or more LEDs after micro-transfer printing the one or more LEDs.

20. The method of claim 18, comprising forming the first and second electrodes or first and second tile micro-wires after providing the layer of light-absorbing material.

* * * * *